United States Patent [19]

Jacobs et al.

[11] 4,342,149

[45] Aug. 3, 1982

[54] METHOD OF MAKING VERY SHORT CHANNEL LENGTH MNOS AND MOS DEVICES BY DOUBLE IMPLANTATION OF ONE CONDUCTIVITY TYPE SUBSEQUENT TO OTHER TYPE IMPLANTATION

[75] Inventors: Erwin Jacobs, Vaterstetten; Ulrich Schwabe; Dezso Takacs, both of Munich, all of Fed. Rep. of Germany

[73] Assignee: Siemens Aktiengesellschaft, Berlin & Munich, Fed. Rep. of Germany

[21] Appl. No.: 202,347

[22] Filed: Oct. 30, 1980

[30] Foreign Application Priority Data

Nov. 23, 1979 [DE] Fed. Rep. of Germany ....... 2947350

[51] Int. Cl.³ ..................... B01J 17/00; H01L 29/78
[52] U.S. Cl. ................... 29/576 B; 29/571; 148/187; 357/23; 357/91
[58] Field of Search ............... 29/576 B, 571; 148/1.5, 148/187; 357/23 VT, 23, 91

[56] References Cited

U.S. PATENT DOCUMENTS

| | | | |
|---|---|---|---|
| 3,996,655 | 12/1976 | Cunningham et al. | 29/571 |
| 4,214,359 | 7/1980 | Kahng | 357/23 |
| 4,217,599 | 8/1980 | Sato et al. | 357/23 |
| 4,257,832 | 3/1981 | Schwabe et al. | 148/187 |
| 4,268,951 | 5/1981 | Elliott et al. | 357/23 |
| 4,280,855 | 7/1981 | Bertin et al. | 148/1.5 |
| 4,282,646 | 8/1981 | Fortino et al. | 148/187 |
| 4,291,321 | 9/1981 | Pfleiderer et al. | 357/23 |

OTHER PUBLICATIONS

Ohkura et al., IEEE Trans. Electron Devices, ED-26, (Apr. 1979), 430.

*Primary Examiner*—Upendra Roy
*Attorney, Agent, or Firm*—Hill, Van Santen, Steadman, Chiara & Simpson

[57] ABSTRACT

A method for manufacturing MNOS memory transistors with very short channel lengths in silicon gate technology. In a substrate of a first semiconductor type, source and drain zones of MNOS and MOS components of a second conductivity type opposite the first conductivity type are provided. The edges of gate electrodes, with reference to the plane of the substrate surface, lie perpendicularly and self-adjusting over the edges of the source and drain zones, whereby the source and drain zones generated in the substrate are manufactured by means of ion implantation upon employment of the gate electrodes as the implantation mask.

4 Claims, 6 Drawing Figures

METHOD OF MAKING VERY SHORT CHANNEL LENGTH MNOS AND MOS DEVICES BY DOUBLE IMPLANTATION OF ONE CONDUCTIVITY TYPE SUBSEQUENT TO OTHER TYPE IMPLANTATION

BACKGROUND OF THE INVENTION

1. Field of the Invention

The invention pertains to the field of fabrication of MNOS and MOS memory devices.

2. The Prior Art

The manner of functioning of a MNOS memory transistor (MNOS = metal-nitride-oxide-semiconductor) depends on the fact that, in an MNOS field effect transistor, the conduction state or, respectively, the threshold voltage of the transistor defined for a prescribed gate voltage is permanently changed by means of spatially stationary charges in the gate double insulation layer or, respectively, in the silicon nitride layer. In programming, negative charges are deposited in the addressed transistors at the boundary surface nitride-oxide or, respectively, in the nitride by means of a voltage pulse, said charges making these transistors permanently blocking. The charges can subsequently be removed by means of a pulse of reverse polarity or by means of other cancelling methods. Another method is "short channel cancelling" in which a positive voltage pulse is applied to the source and drain region, whereas the substrate and gate lie at grounded potential.

The manufacture of a Very Large Scale Integrated (VLSI) circuit requires thin gate oxides (smaller than 0.05 μm). As a result of this demand, the avalanche breakdown voltage at the pn junction on the drain side is reduced. For the short channel cancelling of silicon dioxide/silicon nitride double insulator layer memory elements (MNOS transistors), the cancellation operation (avalanche punch-through breakdown) is rendered more difficult, since the transistors already punch through before the extinction voltage at the pn junctions of the source-drain region is reached.

Self-adjusting methods are sought for the reduction of the tolerances and, thus, for shortening the channel length. Such a method for the manufacture of a MNOS memory cell can be derived from the patent application, U.S. Ser. No. 146,392 (corresponding to German Patent Application P No. 29 18 888.3). Thereby, the effective channel length is adjusted in that the gate electrode is subdivided into two differently drivable, mutually superimposed electrodes (dual gate) and the connection of the gate electrodes is produced via self-adjusting, overlapping contacts. With respect to the plane of the substrate surface, the edges of the second gate electrode lying over the first gate electrode (memory gate) lie perpendicular and self-adjusting over the edges of the source and drain zone. The memory nitride layer extends beyond the area of the channel zone, partially to the source and drain zone.

A method is also known from the prior art (/1/ I. Ohkura et al, Proceedings of the 8th Conference on Solid State Dev., Tokyo 1976, Jap. J. Applied Physics Supplement, 16, 167–171 (1977); /2/ I. Ohkura et al, IEEE Transactions on Electronic Devices, ED-26, 43–435 (1979)) for the manufacture of normal transistors of short channel length in VLSI technology with self-adjusting, double-diffused source-drain regions.

SUMMARY OF THE INVENTION

The present invention solves the problem of the manufacture of MNOS transistors with very short channel length in VLSI technology in a different, simpler and, thus, less costly manner than the prior art. In the present method, after the structuring of the gate electrode and upon employment of a photo-technique, an implantation and subsequent diffusion of ions of the first conductivity type are carried out in the region of the source-drain zones, after the removal of the oxide in the region of the source-drain zone and upon employment of a further photo-technique, a double implantation of ions of the second conductivity type is carried out with differing implantation energy and dose, whereby the gate electrode and the gate oxide or, respectively, gate nitride are employed as implantation masks.

Building on the Ohkura method by means of the employment of three additional masks in the normal silicon gate process, the present method simultaneously produces MNOS transistors with effective channel lengths <1 μm, symmetrical and asymmetrical double-diffused, self-adjusted MOS transistors and normal MOS transistors on the same chip. By so doing, all of the advantages of short channel extinction can be fully utilized, on the one hand, for the memory transistors. On the other hand, the high electric strength of the double diffused, self-adjusting MOS transistors can be fully utilized for the peripheral circuits.

For increasing the certainty in the avoidance of short-circuits, the nitride layer of the MNOS memory transistors is structured in such a manner that it extends beyond the region of the channel zone partially onto the region of the source and drain zone.

DESCRIPTION OF THE PREFERRED EMBODIMENTS

Not by way of limitation, but by way of disclosing the best mode and by way of enabling one of ordinary skill in the art to practice our invention, FIGS. 1 to 6 show an illustrative use of our invention.

Figure 1:
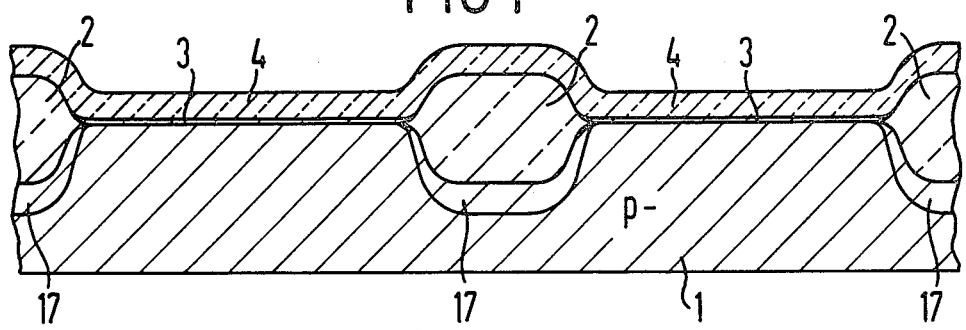
FIG. 1 discloses a substrate with structured insulating layers and a nitride layer formed thereon.

FIG. 1 proceeds from a p-doped (100)-oriented silicon substrate 1 which is provided with structured SiO$_2$ layers 2 (so-called field oxide) for the separation of the active transistor regions by means of an isoplanar method—also designated as LOCOS (Local Oxidation of Silicon) method. The p-doped silicon substrate 1 is first provided with a 50 nm thick SiO$_2$ layer and a 100 nm thick silicon nitride layer. After the structuring and a possible field implantation 17, a 700 nm thick SiO$_2$ layer 2 functioning as a thick oxide is oxidized onto the silicon substrate. Subsequently thereto, the silicon nitride layer is removed. In a further method step, a 3 nm thick silicon oxide layer 3 functioning as tunnel oxide is then deposited surface-wide and the memory nitride layer 4 is applied thereon in a layer thickness of 40 nm.

Figure 2:
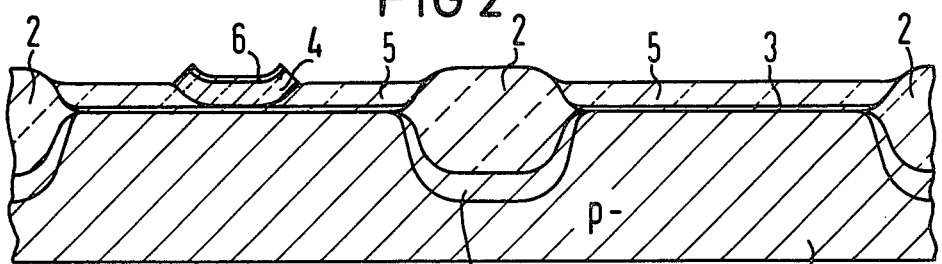
FIG. 2 shows the substrate of FIG. 1 with the nitride layer partly removed and with an SiO$_2$ layer on the surface of the substrate.

As illustrated in FIG. 2, this memory nitride layer 4 is structured by means of masking technology in such a manner that it remains in the region of the memory transistor. Subsequent thereto, the 50 nm thick $SiO_2$ layer functioning as the gate oxide 5 for the non-memory transistor is thermally oxidized on, whereby the region over the silicon nitride layer surface 4 verges into an approximately 15 nm thick oxynitride layer 6.

Figure 3:
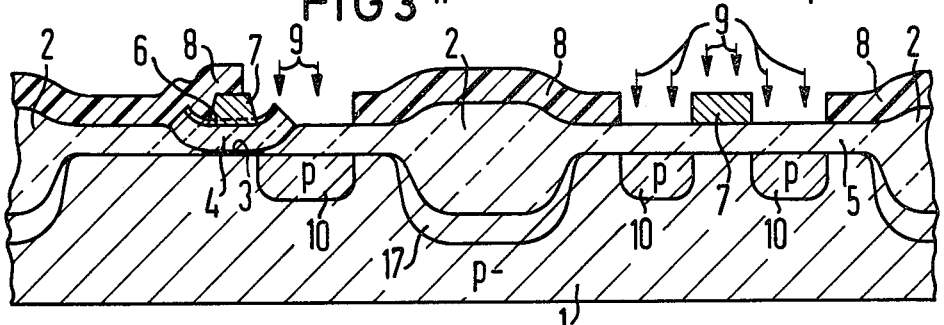
FIG. 3 shows the substrate of FIG. 2 with gate electrodes and an implantation mask formed thereon.
Figure 4:
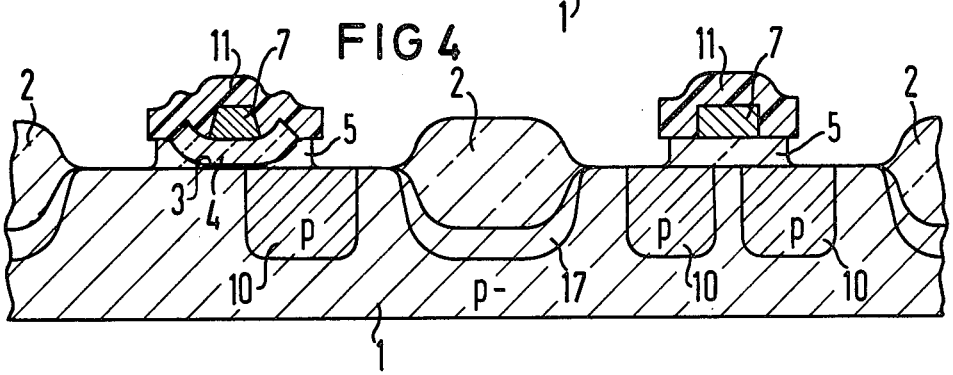
FIG. 4 shows the substrate of FIG. 3 after a diffusion step has formed selected P-doped regions and prior to a double ion implantation step.

An arrangement can be seen from FIG. 3 in which the polysilicon applied subsequent to the gate oxidation (5) is structured as gate electrode 7 and, upon employment of a first phototechnology step (photosensitive resist 8), is employed as the implantation mask for a boron implantation (cf. arrow 9). The p-doped regions 10 arise by means of this implantation (9), given a dose of $2\times10^{12}$ through $1\times10^{13} B^+ cm^{-2}$ and an implantation energy of 35 keV.

Then, after stripping the photosensitive resist layer 8, a diffusion process (drive in) is carried out. As can be seen from FIG. 4, the p-doped regions 10 thus expand and penetrate far under the gate oxide 5 and under the silicon nitride layer 4. A further photosensitive resist layer 11 (second phototechnique step) is then applied onto this arrangement. Resist layer 11 is structured in such a manner that the gate oxide 5 and the oxynitride or, respectively, nitride layer 4, can be employed as the implantation mask for the first implantation of the subsequent double implantation for generating the n-regions (13 and 14) functioning as source-drain zone.

Figure 5:
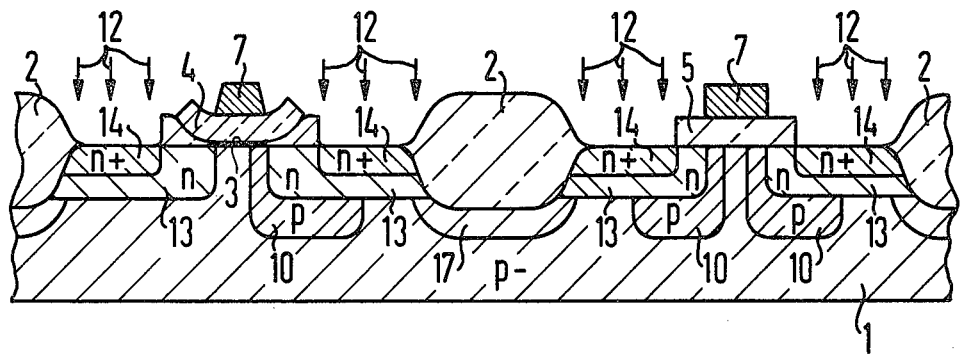
FIG. 5 shows the double ion implantation step applied to the substrate of FIG. 4.

This double implantation—as illustrated in FIG. 5—is carried out with arsenic ions (cf. arrow 12) of differing implantation energy and dose after stripping the photosensitive resist layer 11. An arsenic ion implantation of $8\times10^{15} As^+ cm^{-2}$ at 25 keV is first carried out and an arsenic ion implantation of $2\times10^{15} As^+ cm^{-2}$ at 100 keV is subsequently carried out. As a result, the n-regions 13 and n+-regions 14 arise in the substrate 1 and in the p-doped zones. The location marked with the double arrow 15 (see FIG. 6) indicates the channel lying in the submircon range.

Figure 6:
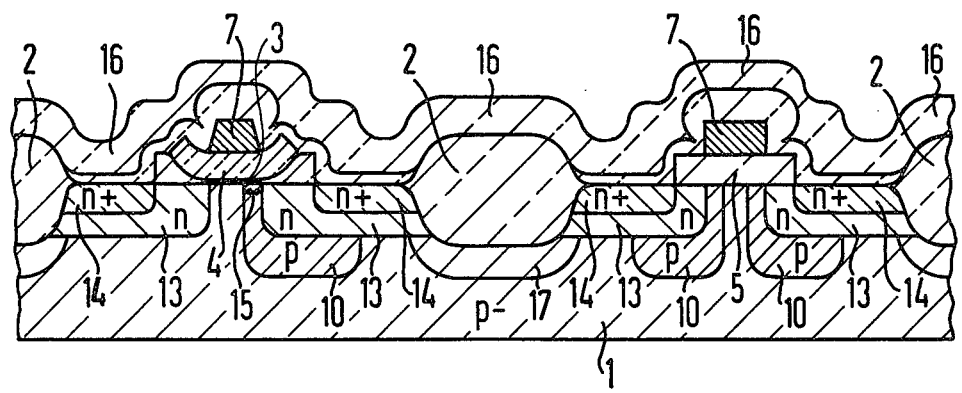
FIG. 6 shows the substrate of FIG. 5 after curing and with an applied layer of intermediate oxide.

After the curing of the implantation has been carried out, as illustrated in FIG. 6, an intermediate oxide 16 is applied to a thickness of 0.5 nm by means of thermal oxidation and low pressure chemical vapor deposition (LPCVD). The layer 16 is structured in a known manner for generating contact holes. The metallization and the application of a protective layer occur as in known silicon gate processes.

It will be apparent to those skilled in the art that many modifications and variations may be effected without departing from the spirit and scope of the novel concepts of the present invention.

We claim as our invention:

1. A method for the manufacture of MNOS memory transistors with very short channel lengths utilizing a silicon substrate of a first conductivity type provided with a structured field oxide $SiO_2$ layer for the separation of the active transistor regions comprising the steps of:
    (a) forming a silicon oxide layer effective as a tunnel oxide on a surface of the silicon substrate of the first conductivity type;
    (b) applying a silicon nitride layer serving as a memory layer over the entire surface of the tunnel oxide layer;
    (c) structuring and retaining the memory nitride layer in the region of the memory transistor while selectively removing it elsewhere;
    (d) executing a surface-wide oxidation to form a gate oxide for the non-memory transistor and an oxynitride layer on the memory nitride;
    (e) precipitating a polysilicon layer and structuring the polysilicon layer as a gate electrode in the region of the memory transistor and of the non-memory transistor;
    (f) selectively applying a first layer of photosensitive resist to form an implantation mask over the field oxide regions and over the gate electrode of the memory transistor;
    (g) implanting ions of the first conductivity type into selected regions of the substrate;
    (h) stripping the photosensitive resist mask and diffusing ions of the first conductivity type into the substrate;
    (i) selectively applying a second layer of photosensitive resist to form an implantation mask in the region of the gate oxide for the non-memory transistor and of the gate oxide and oxynitride layer of the memory transistor;
    (j) implanting low energy ions of a second conductivity type forming source/drain zones;
    (k) stripping the photosensitive resist mask;
    (l) implanting higher energy ions of the second conductivity type thereby forming n+ regions active as source/drain zones and for generating the short channel; and
    (m) precipitating a protective intermediate oxide over the surface of the substrate, generating contact holes, and fabricating metal contacts.

2. The method according to claim 1 wherein the energies and doses of said double implantation step are characterized in that, for manufacturing an n-channel-MNOS memory transistor, a boron implantation with an implantation dose of $2\times10^{12}$ through $1\times10^{13} B^+ cm^{-2}$ and an energy of 35 keV is carried out as the first implantation and, as the second implantation, an arsenic implantation of, first $8\times10^{15} As^+ cm^{-2}$ and 25 keV and, then, of $2\times10^{15} As^+ cm^{-2}$ and 100 keV is carried out.

3. The method according to claim 2, characterized in that the thickness of the tunnel oxide layer lies in the range from 2.0 nm through 3.5 nm and the thickness of the silicon nitride layer for the memory transistor is set to a range from 20 nm through 50 nm, particularly 40 nm.

4. The method according to claim 3 characterized in that the nitride layer of the MNOS memory transistors is structured such that it extends beyond the region of the channel zone partially onto the region of the source and drain zone.

* * * * *